US008926390B2

(12) United States Patent
Fujimura et al.

(10) Patent No.: US 8,926,390 B2
(45) Date of Patent: Jan. 6, 2015

(54) METHOD FOR MANUFACTURING ORGANIC EL DISPLAY AND ORGANIC EL DISPLAY

(75) Inventors: Hiroshi Fujimura, Aichi (JP); Mitsuru Asano, Kanagawa (JP); Toshiaki Imai, Kanagawa (JP)

(73) Assignee: Sony Corporation, Tokyo (JP)

( * ) Notice: Subject to any disclaimer, the term of this patent is extended or adjusted under 35 U.S.C. 154(b) by 421 days.

(21) Appl. No.: 12/140,775

(22) Filed: Jun. 17, 2008

(65) Prior Publication Data

US 2009/0009068 A1    Jan. 8, 2009

(30) Foreign Application Priority Data

Jul. 6, 2007    (JP) ................. 2007-177992

(51) Int. Cl.
*H01L 51/56*    (2006.01)
*H05B 33/06*    (2006.01)
*H01L 27/32*    (2006.01)
*H01L 51/52*    (2006.01)

(52) U.S. Cl.
CPC ............ *H05B 33/06* (2013.01); *H01L 27/3276* (2013.01); *H01L 51/5228* (2013.01); *H01L 51/5206* (2013.01); *H01L 51/5237* (2013.01); *H01L 51/56* (2013.01); *H01L 2251/5315* (2013.01)
USPC ............................................ 445/58; 313/504

(58) Field of Classification Search
CPC ........................................................ H01L 51/56
USPC ............ 313/498–512; 315/169.3; 345/36, 45, 345/76; 445/24, 58
See application file for complete search history.

(56) References Cited

U.S. PATENT DOCUMENTS 4,599,639 A * 7/1986 Hynecek ........................ 257/363
6,157,066 A * 12/2000 Kobayashi .................... 257/363
7,224,115 B2 * 5/2007 Sato et al. ..................... 313/504
2002/0011783 A1 * 1/2002 Hosokawa .................... 313/504
2002/0158835 A1 * 10/2002 Kobayashi et al. ........... 345/100

FOREIGN PATENT DOCUMENTS

| JP | 05-142567 | 6/1993 |
|---|---|---|
| JP | 2004-047222 | 2/2004 |
| JP | 2004-139970 | 5/2004 |
| JP | 2004-207217 | 7/2004 |
| JP | 2005-174931 A | 6/2005 |
| JP | 2005-311328 | 11/2005 |
| JP | 2007-134243 | 5/2007 |
| JP | 2007-149406 A | 6/2007 |
| KR | 10-20040076214 | 8/2004 |

OTHER PUBLICATIONS

Japanese Office Action issued on Jun. 16, 2009 in connection with JP Application No. 2007-177992.
Japanese Patent Office, Office Action issued in Patent Application JP 2007-177992, on Oct. 5, 2010.
Korean Office Examination issued in connection with related Korean Patent application No. 10-2008-0063703 dated Jun. 18, 2014.

* cited by examiner

*Primary Examiner* — Nimeshkumar Patel
*Assistant Examiner* — Christopher Raabe
(74) *Attorney, Agent, or Firm* — Dentons US LLP

(57) ABSTRACT

Disclosed herein is a method for manufacturing an organic electroluminescence display including multilayer structures that are each formed in a respective one of pixel areas in an effective area of a substrate and are each formed by a lower electrode, an organic layer, and an upper electrode, the organic electroluminescence display having a common electrode that electrically connects the pixel areas, the method including the steps of: forming a protective electrode and an outer-peripheral electrode that are electrically connected to the common electrode; forming the multilayer structures; and carrying out film deposition treatment involving electrification of the substrate.

14 Claims, 18 Drawing Sheets

F I G . 1
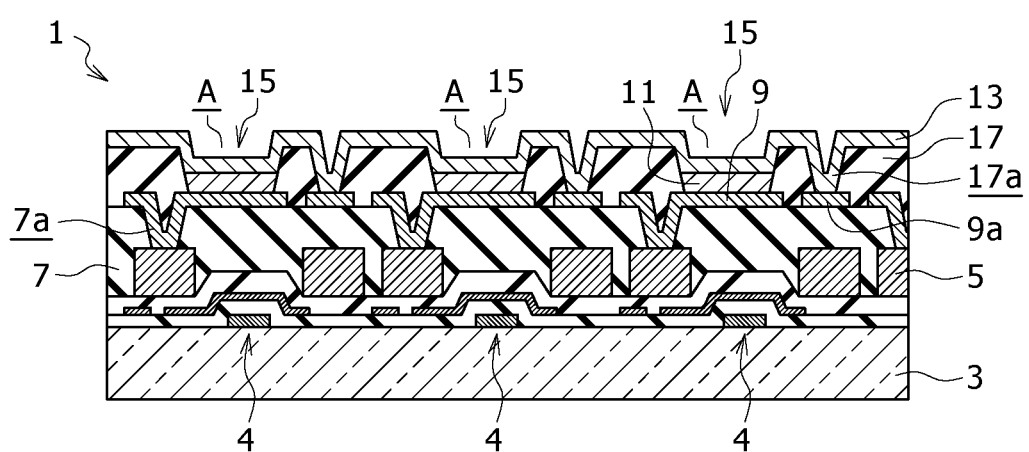

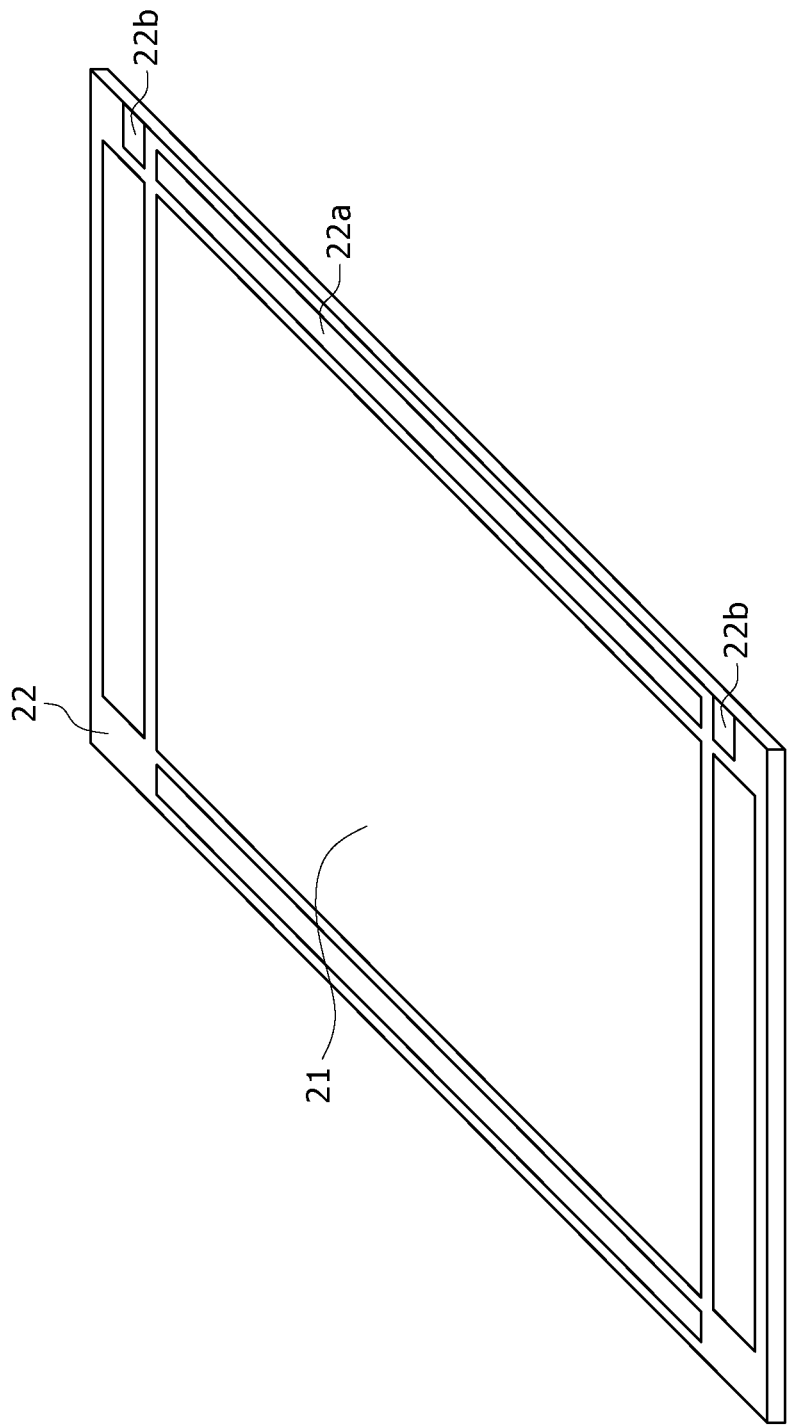

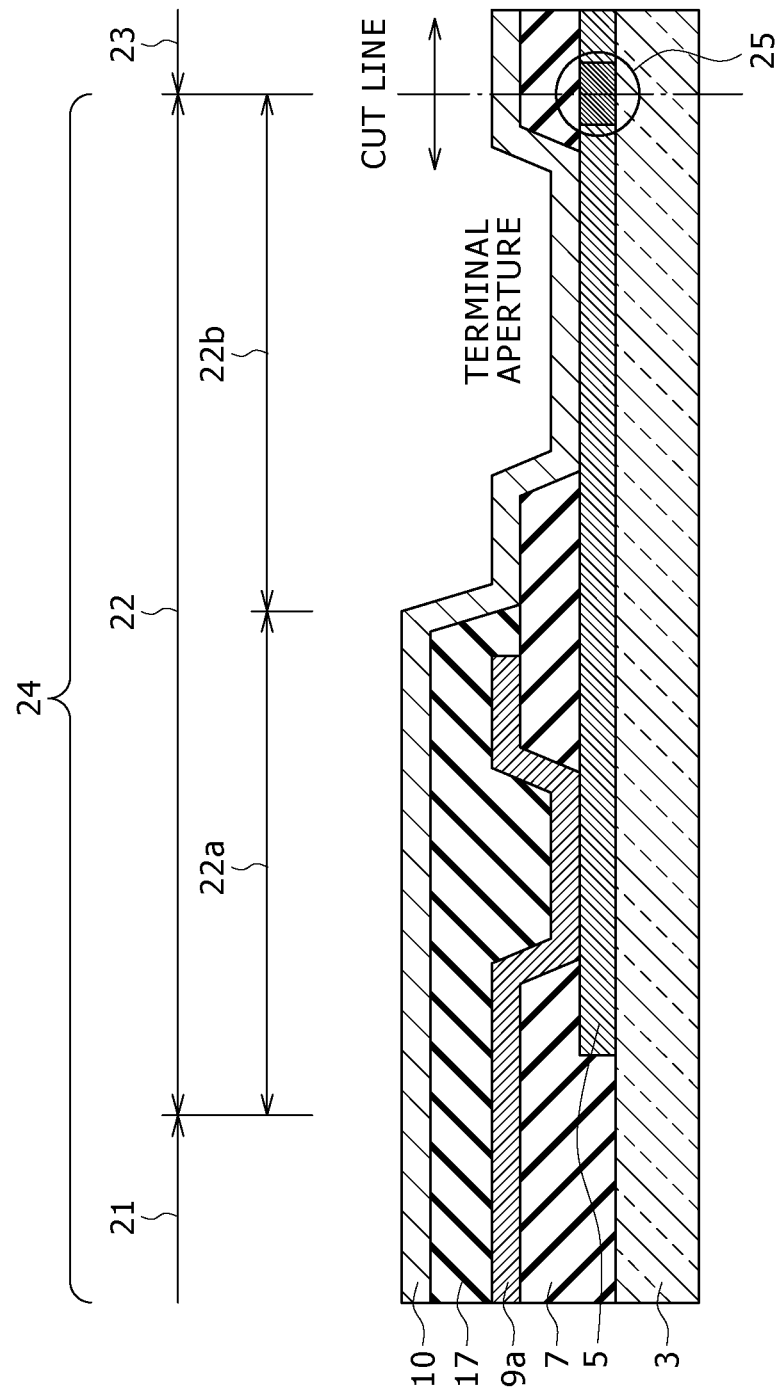

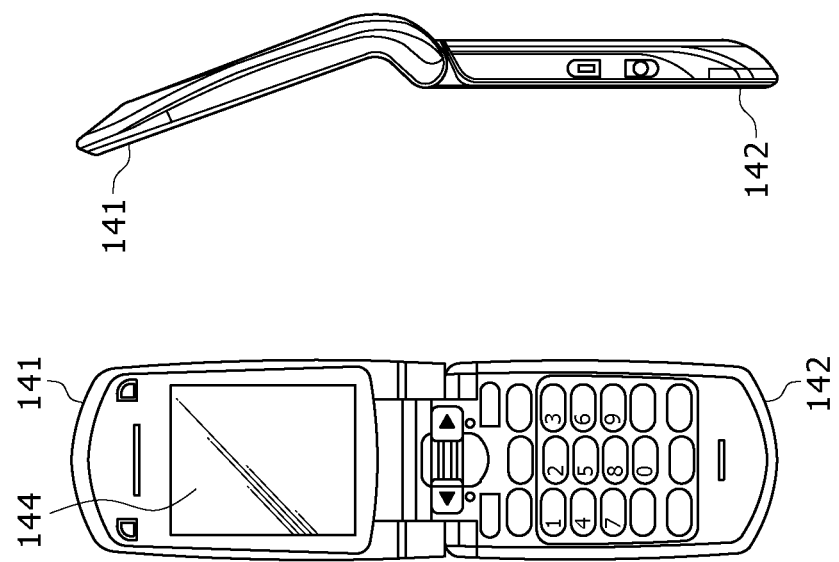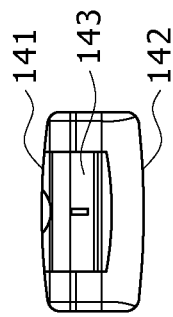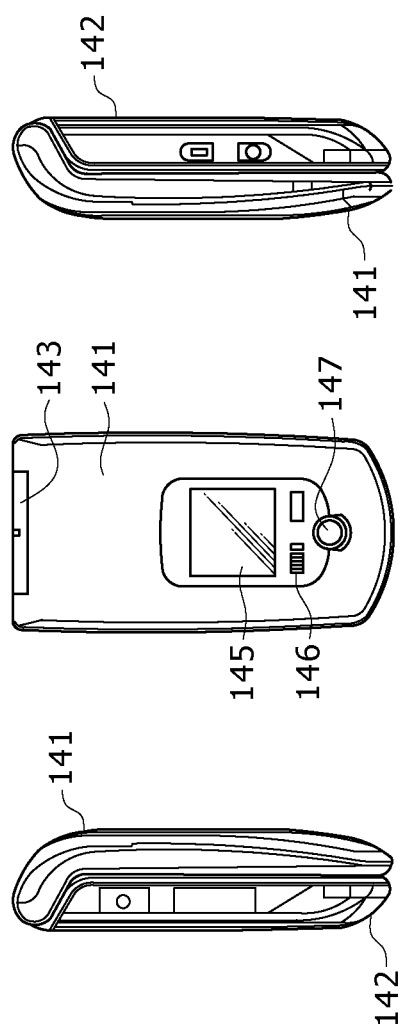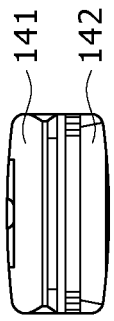

METHOD FOR MANUFACTURING ORGANIC EL DISPLAY AND ORGANIC EL DISPLAY

CROSS REFERENCES TO RELATED APPLICATIONS

The present invention contains subject matter related to Japanese Patent Application JP 2007-177992 filed in the Japan Patent Office on Jul. 6, 2007, the entire contents of which being incorporated herein by reference.

BACKGROUND OF THE INVENTION

1. Field of the Invention

The present invention relates to a method for manufacturing an organic electroluminescence (EL) display including organic EL elements and an organic EL display obtained by the manufacturing method.

2. Description of the Related Art

In recent years, organic EL displays including organic EL elements as light-emitting elements are attracting attention as flat displays. The organic EL display is a self-luminous flat panel display that demands no backlight, and has an advantage that it can realize a display with a wide viewing angle, which is a characteristic of the self-luminous display. Furthermore, the organic EL display is advantageous over backlight-type displays (such as liquid crystal displays) in the power consumption because only the necessary pixels are turned to the light-emission state in the organic EL display. In addition, the organic EL display is considered to have sufficient response performance with respect to high-definition and high-speed video signals that are expected to be put into practical use in the future.

In a general organic EL display, a lower electrode serving as a positive electrode (anode) is formed over a substrate formed of e.g. a glass panel. On the lower electrode, an organic layer composed of a hole transport layer and a light-emitting layer is formed. On the organic layer, an upper electrode serving as a negative electrode (cathode) is formed. Based on this structure, an organic EL element is formed at each position at which the lower electrode, the organic layer, and the upper electrode overlap with each other. A light-emission area is formed by vertically and horizontally arranging these organic EL elements. In a peripheral area thereof, an electrode portion for connecting the respective organic EL elements to an external circuit or internal drive circuit is formed (refer to e.g. Japanese Patent Laid-Open No. 2004-207217 and Japanese Patent Laid-Open No. 2004-139970).

For the general organic EL display having such a structure, as shown in FIG. 19 for example, an area 54 outside an effective area 53 (area composed of a light-emission area 51 and a peripheral area 52 thereof) on the substrate is removed (along the cut lines in FIG. 19) after the film deposition of the respective layers, so that the organic EL display is completed. In this case, the effective area 53 and the other area 54 are not electrically connected to each other in general.

SUMMARY OF THE INVENTION

The organic EL display is manufactured by using various film deposition techniques, specifically publicly-known vacuum evaporation techniques and chemical vapor deposition (CVD) techniques. For example, after the step of forming the organic EL elements and before the step of leaving only the effective area 53, a silicon nitride (SiN) film covering the entire substrate including the organic EL elements is formed as a protective film for protecting the entire substrate by CVD deposition treatment involving electrification.

However, in a related-art manufacturing process for an organic EL display, a part that looks white turbidity is possibly generated in the vicinity of the outer periphery of the light-emission area 51 attributed to e.g. an electrification charge arising due to plasma generation in the CVD deposition treatment. This phenomenon is due to the possibility that a potential difference arises between the effective area 53 and the other area 54 attributed to the plasma generation in the CVD deposition treatment and this potential difference precludes the protective film from being uniformly formed by the CVD deposition treatment. Specifically, the electrification charge of the protective film accumulates in the vicinity of the outer periphery of the light-emission area 51 attributed to the potential difference in the plane of the light-emission area 51. This charge accumulation causes film roughening on the surface of the protective film, and this film roughening looks white turbidity. Furthermore, the plasma generation possibly imposes electric damage on electric circuits such as a thin film transistor (hereinafter, referred to as a "TFT") circuit included in the organic EL display.

There is a need for the present invention to provide an improved method for manufacturing an organic EL display, allowing suppression of the adverse effect of an electrification charge that is possibly generated in film deposition treatment in the manufacturing process, and to provide an organic EL display manufactured by the method.

According to an embodiment of the present invention, there is provided a method for manufacturing an organic EL display including multilayer structures that are each formed in a respective one of pixel areas in an effective area of a substrate and are each formed by a lower electrode, an organic layer, and an upper electrode. The organic EL display has a common electrode that electrically connects the pixel areas. The method includes the steps of forming a protective electrode and an outer-peripheral electrode that are electrically connected to the common electrode, forming the multilayer structures, and carrying out film deposition treatment involving electrification of the substrate.

In the method for manufacturing an organic EL display based on this configuration, the protective electrode that is electrically connected to the common electrode and the outer-peripheral electrode are formed before the film deposition treatment involving electrification of the substrate. Therefore, even when a film is charged in the film deposition treatment, the electrification charge flows toward the outside of the effective area due to a charge flow to the protective electrode and the outer-peripheral electrode. This avoids the occurrence of accumulation of the electrification charge at a certain position in the effective area.

According to the embodiment of the present invention, the accumulation of the electrification charge at a certain position in the effective area is avoided. Therefore, even if film deposition treatment involving electrification such as CVD deposition by use of plasma treatment is carried out in the manufacturing process for an organic EL display, it is possible to suppress generation of white turbidity at a certain position in the effective area attributed to the electrification charge generated in the film deposition treatment. Moreover, the charge flow toward the outside of the effective area can also avoid electric damage to electric circuits included in the organic EL display. Consequently, an organic EL display free from the occurrence of white turbidity and electric damage can be manufactured, which allows enhancement in the manufacturing quality, manufacturing yield, and so forth.

BRIEF DESCRIPTION OF THE DRAWINGS

FIG. 1 is a major-part sectional view showing one example of the schematic structure of a display area of an organic EL display;

FIG. 3 is a perspective view showing a schematic configuration example of the organic EL display;

FIG. 4 is an explanatory diagram showing one example of a manufacturing step for an organic EL display according to a first embodiment of the present invention;

FIGS. 18A to 18G are diagrams showing a cellular phone as portable terminal apparatus as one specific example of electronic apparatus.

DETAILED DESCRIPTION OF THE PREFERRED EMBODIMENTS

Figure 2A:
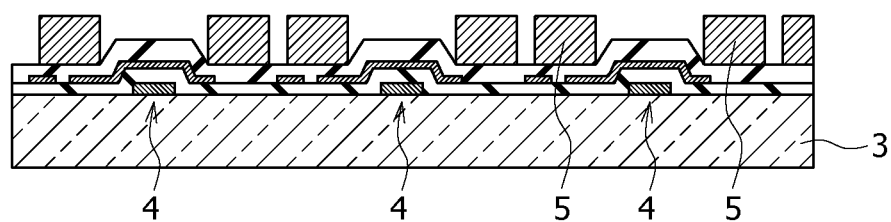
FIGS. 2A to 2F are explanatory diagrams showing one example of manufacturing steps for the organic EL display.

Methods for manufacturing an organic EL display and organic EL displays according to embodiments of the present invention will be described below based on the drawings.

First Embodiment

Initially, the schematic structure of an organic EL display will be described below.

FIG. 1 is a major-part sectional view showing one example of the schematic structure of the display area of the organic EL display. In this example, the schematic structure of an active-matrix organic EL display in which organic EL elements are arranged as light-emitting elements is shown.

An organic EL display 1 of this example includes TFTs 4 in the respective pixels over a substrate 3. Over the substrate 3 on which the TFTs 4 are formed, interconnects 5 connected to the sources and drains of the TFTs 4 are formed, and a planarization insulating film 7 is provided to cover these interconnects 5. The TFT 4 is not limited to the bottom-gate TFT shown in FIG. 1 but may be a top-gate TFT. The gate electrodes of the TFTs 4 are connected to a scan circuit.

In each of pixel apertures A over this planarization insulating film 7, an organic EL element 15 arising from stacking of a lower electrode 9, an organic layer 11, and an upper electrode 13 is provided. In particular, in the organic EL display 1 of the present embodiment, an auxiliary interconnect 9*a* formed of the same layer as that of the lower electrode 9 is provided among the pixel apertures A in which the organic EL elements 15 are provided. The pixel apertures A are formed in an insulating film 17 that covers the lower electrodes 9.

The lower electrode 9 of the organic EL element 15 is connected to the interconnect 5 via a connection hole 7*a* formed in the planarization insulating film 7, and is so formed as to have a pattern somewhat larger than the pixel aperture A.

The auxiliary interconnect 9*a* formed of the same layer as that of the lower electrodes 9 is continuously disposed in a mesh manner among the pixel apertures A arranged in a matrix over the substrate 3 for example, and is so patterned that insulation from the lower electrodes 9 is kept.

The peripheral edges of these lower electrodes 9 and the auxiliary interconnect 9*a* are covered by the insulating film 17 through which the center parts of the lower electrodes 9 are exposed. The openings of the insulating film 17 for exposing the center parts of the lower electrodes 9 serve as the pixel apertures A. In the insulating film 17, connection holes 17*a* that reach the auxiliary interconnect 9*a* are provided in addition to the pixel apertures A. The connection holes 17*a* are provided at the positions according to need, and do not need to be provided corresponding to each of the pixel apertures A.

The organic layer 11 is formed as a pattern for each of the pixel apertures A in such a manner as to cover the lower electrode 9 exposed in the pixel aperture A defined by the insulating film 17.

The upper electrode 13 is so provided as to completely cover the organic layer 11 and be connected to the auxiliary interconnect 9*a* via the connection holes 17*a* provided in the insulating film 17. This upper electrode 13 may be provided as a blanket film above the substrate 3. Alternatively, for each of plural areas, it may be formed as patterns each shared by plural pixels.

Because the TFT 4 is formed in each of the pixels over the substrate 3 in this organic EL display 1, it is advantageous for this organic EL display 1 to have a top-emission structure that allows extraction of emitted light through the upper electrode 13 on the opposite side to the substrate 3, in terms of ensuring of a high aperture ratio of the organic EL elements. In the case of the top-emission display, the substrate 3 is not limited to a substrate composed of a transparent material.

If the organic EL display 1 is a top-emission display, it is preferable for the lower electrode 9 to be composed of a metal material having favorable light reflectivity, such as aluminum (Al), silver (Ag), a silver alloy composed mainly of silver (Ag), or chromium (Cr), so that emitted light may be reflected toward the upper electrode 13. In particular, using silver (Ag) or a silver alloy is preferable because it can reflect more emitted light.

Furthermore, in this case, a two-layer structure obtained by providing an electrically-conductive oxide material layer having optical transparency and excellent surface flatness on this metal material layer may be employed for the purpose of planarizing the surface of the lower electrode 9. This conductive oxide material layer serves also as a barrier layer for preventing oxidation of the metal material layer having favorable reflectivity, composed of e.g. silver (Ag) in particular.

In addition, under the metal material layer, another electrically-conductive oxide material layer serving as an adhesion layer to the underlying planarization insulating film 7 may be provided, so that a three-layer structure obtained by interposing the metal material layer between the conductive oxide material layers may be employed.

The lower electrode 9 is used as the anode or cathode. Depending on whether it is used as the anode or cathode, a material having a proper work function is selected and used therefor. For example, when the lower electrode 9 is used as the anode, as the uppermost layer in contact with the organic layer 11, a layer composed of a material having a high work function is used as a hole injection layer. Thus, when the lower electrode 9 is formed by employing the above-described two-layer structure or three-layer structure, a layer composed of an indium oxide such as indium tin oxide (ITO) or indium zinc oxide (IZO) having a high work function and favorable optical transparency is used as the uppermost conductive oxide material layer. ITO or IZO is used also for the conductive oxide material layer provided as the adhesion layer between the metal material layer and the planarization insulating film 7.

Consequently, as the structure of the lower electrode 9 used as the anode and the auxiliary interconnect 9a, a three-layer structure obtained by interposing a metal material layer composed of silver (Ag) between electrically-conductive oxide material layers composed of ITO can be cited.

The organic layer 11 is formed of a multilayer structure including at least a light-emitting layer, and arises from sequential stacking of a hole injection layer, light-emitting layer, electron transport layer, and electron injection layer in that order from the anode side, for example. These layers are adequately selected so as to be stacked.

If this organic EL display 1 is a top-emission display, it is preferable for the upper electrode 13 to be composed of a material having optical transparency and have a sufficiently-small thickness in order to achieve favorable light-extraction efficiency. If the lower electrode 9 is the anode, the upper electrode 13 is used as the cathode.

In contrast to the above description, if the organic EL display 1 is a transmissive display from which emitted light is extracted through the substrate 3, the substrate 3 and the lower electrodes 9 are formed by using a material having optical transparency. On the other hand, the upper electrode 13 is formed by using a material having favorable light reflectivity.

In the organic EL display 1 having the above-described structure, the auxiliary interconnect 9a connected to the upper electrode 13 is not formed by using a special layer but is formed of the same layer as that of the lower electrodes 9. Due to this feature, without complication of the layer structure of the organic EL display 1, the electric resistance of the upper electrode 13 can be lowered through the connecting of the auxiliary interconnect 9a thereto. Thus, for example, even when the organic EL display 1 is a top-emission display that allows light extraction through the upper electrode 13 and therefore the upper electrode 13 is demanded to have optical transparency and hence a smaller thickness, it is possible to decrease the resistance of the upper electrode 13 to thereby prevent a voltage drop thereacross without complication of the layer structure. As a result, the display is allowed to keep favorable displaying characteristics.

Next, a description will be made below about one example of a method for manufacturing the organic EL display having the above-described structure and a specific example of the further-detailed structure of the organic EL display.

FIGS. 2A to 2F are explanatory diagrams showing one example of manufacturing steps for the organic EL display.

In the manufacturing of the organic EL display having the above-described structure, as shown in FIG. 2A, initially the TFTs 4 and the interconnects 5 connected to the sources and drains of the TFTs 4 are formed over the substrate 3 formed of e.g. a glass substrate.

Figure 2B:
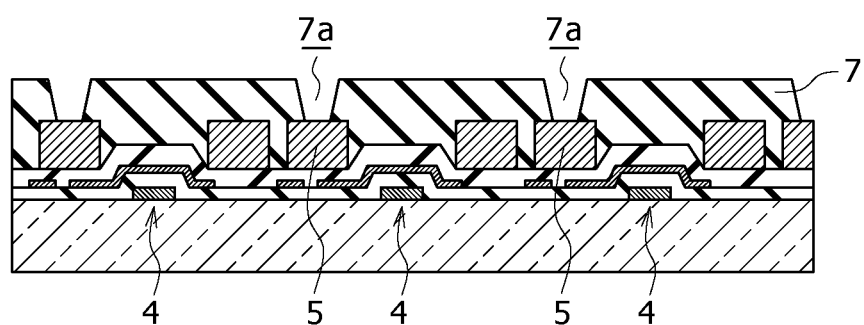

Subsequently, as shown in FIG. 2B, the planarization insulating film 7 is so formed over the substrate 3 as to fill recesses and projections generated on the surface side of the substrate 3 due to the formation of the TFTs 4 and the interconnects 5. For the formation of the planarization insulating film 7, for example, positive-type photosensitive polyimide is applied over the substrate 3 by spin-coating, and then pattern exposure in which only the part above the interconnects 5 is irradiated with exposure light by exposure apparatus is carried out, followed by development by puddle-system developing apparatus. Subsequently, main baking for imidizing (cyclizing) the polyimide is carried out in a clean-bake furnace. This forms the planarization insulating film 7 having the connection holes 7a that reach the interconnects 5. For example, this planarization insulating film 7 is formed to have a thickness of about 2.0 μm if the recesses and projections existing after the formation of the interconnects 5 have a height difference of about 1.0 μm.

Figure 2C:
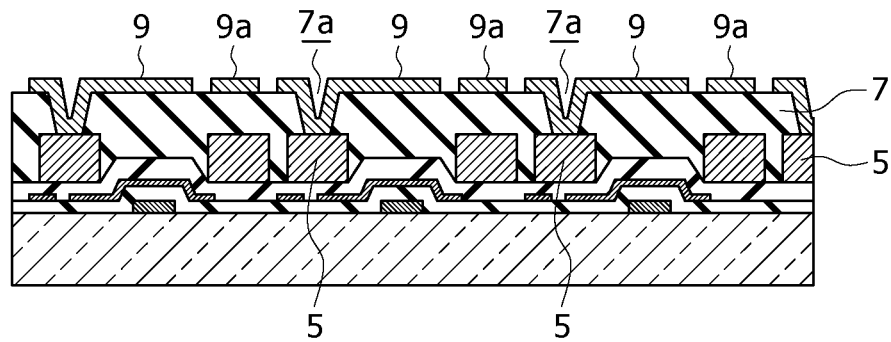

Referring next to FIG. 2C, the lower electrodes 9 and the auxiliary interconnect 9a are formed on the planarization insulating film 7. In the present example, the lower electrodes 9 to serve as the anodes are formed. In this case, initially an electrically-conductive oxide material layer (composed of e.g. ITO) serving as an adhesion layer is deposited by DC sputtering to a thickness of about 20 nm on the planarization insulating film 7. Subsequently, a metal material (e.g. Ag) is deposited by DC sputtering to a thickness of about 100 nm. Thereafter, on this metal material layer, an electrically-conductive oxide material layer (composed of e.g. ITO) serving as a barrier layer, hole injection layer, and planarization layer is deposited by DC sputtering to a thickness of about 10 nm.

The thickness of the conductive oxide material layer formed as the adhesion layer may be any as long as this layer allows adhesion. If this layer is composed of ITO, it is formed to have a thickness in the range of 5 nm to 100 nm. The thickness of the metal material layer may be any as long as this layer prevents emitted light from passing therethrough and can be processed. If this layer is composed of Ag, it is formed to have a thickness in the range of 50 nm to 500 nm. The conductive oxide material layer serving as the barrier layer, hole injection layer, and planarization layer is formed to have a thickness in the range of 3 nm to 50 nm, which corresponds to the limit of processing.

Subsequently, these metal material layer and conductive oxide material layers are patterned by etching in which a resist pattern formed by a general lithography technique is used as the mask. As a result, the lower electrodes 9 connected to the interconnects 5 via the connection holes 7a are arranged in a matrix corresponding to the respective pixel parts. Furthermore, the auxiliary interconnect 9a is formed among these lower electrodes 9.

In the case of forming the lower electrodes 9 and the auxiliary interconnect 9a having a two-layer structure, a metal material layer (composed of e.g. Ag) is deposited on the planarization insulating film 7 to a thickness of about 150 nm by DC sputtering, and then an ITO layer is deposited thereon to a thickness of about 10 nm, followed by patterning of these layers.

Figure 2D:
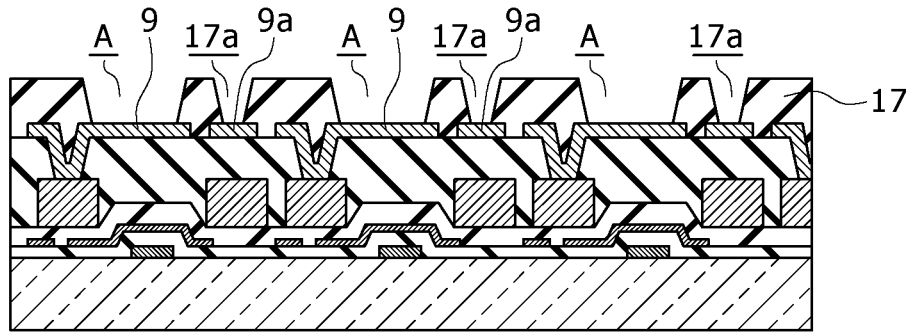

Thereafter, as shown in FIG. 2D, the insulating film 17 having the pixel apertures A and the connection holes 17a is formed. For the formation of the insulating film 17, initially a silicon dioxide ($SiO_2$) film is deposited by e.g. CVD to a thickness of about 1.0 μm. Thereafter, the silicon dioxide film is patterned by etching in which a resist pattern formed by a general lithography technique is used as the mask. This etching is carried out under the condition that allows the sidewall resulting from the etching to have a tapered shape. As a result, the insulating film 17 is obtained that is formed of the silicon dioxide film and has the pixel apertures A that expose the center parts of the lower electrodes 9 and the connection holes 17a that reach the auxiliary interconnect 9a. This insulating film 17 is not limited to a silicon dioxide film.

Figure 2E:
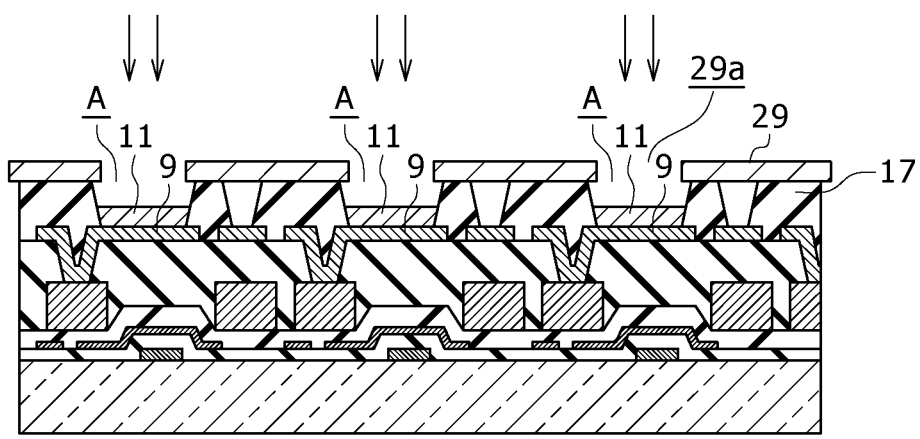

Referring next to FIG. 2E, the organic layer 11 is formed as patterns that each have a shape covering the lower electrode 9 exposed at the bottom of the pixel aperture A. For the formation of the organic layer 11, evaporation deposition by use of a low-molecular organic material is carried out in the state in which an evaporation mask 29 is disposed to face the insulating film 17 in the present example. This evaporation mask 29 has apertures 29a corresponding to the formation part of the organic layer 11. In order that the organic layer 11 is so formed as to surely cover the lower electrode 9 in the pixel aperture A, the apertures 29a are so designed that, in plan view from the evaporation mask side, the edge of each aperture 29a overlaps with the sidewall of the insulating film 17 around the pixel aperture A so that the whole of the exposed part of the lower electrode 9 may be exposed through the aperture 29a.

By the evaporation deposition with use of this evaporation mask 29, the organic layer 11 is formed that is obtained by sequentially stacking, from the lower electrode 9 side, e.g. 4,4',4"-tris(3-methylphenylphenylamino)triphenylamine (MTDATA) as a hole injection layer, bis(N-naphthyl)-N-phenylbenzidine (α-NPD) as a hole transport layer, and a 8-quinolinol aluminum complex (Alq3) as a light-emitting layer.

In the evaporation deposition, 0.2 g of each of the materials of the organic layer 11 is loaded on a boat for resistive heating and each boat is attached to a predetermined electrode in vacuum evaporation apparatus. Subsequently, the pressure in the evaporation chamber is decreased to about $0.1 \times 10^{-4}$ Pa, and then voltage is sequentially applied to the respective boats, to thereby sequentially deposit the plural organic materials by evaporation. The thicknesses of the respective material layers are as follows: 30 nm for MTDATA as the hole injection layer, 20 nm for α-NPD as the hole transport layer, and 30 nm for Alq3 as the light-emitting layer.

In the above-described evaporation deposition, the evaporation mask 29 may be disposed on the insulating film 17 to keep a predetermined distance between the evaporation mask 29 and the substrate 3.

Figure 2F:
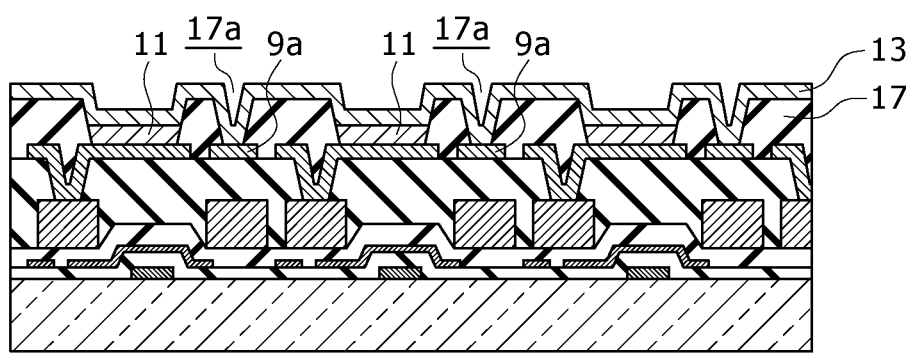

After the above-described step, as shown in FIG. 2F, the upper electrode 13 is formed that covers the organic layers 11 and the insulating film 17 and is connected to the auxiliary interconnect 9a via the connection holes 17a in the insulating film 17. In the present example, an Mg—Ag film to serve as the cathode is formed by co-evaporation across the entire surface over the substrate 3.

For the formation of the upper electrode 13, 0.1 g of Mg and 0.4 g of Ag are loaded on the respective boats and each boat is attached to a predetermined electrode in vacuum evaporation apparatus. Subsequently, the pressure in the evaporation chamber is decreased to about $0.1 \times 10^{-4}$ Pa, and then voltage is applied to the respective boats, to thereby carry out the co-evaporation of Mg and Ag above the substrate 3. As one example, the ratio of the deposition rate of Mg to that of Ag is set to about 9 to 1, and the Mg—Ag film is formed to a thickness of about 10 nm.

The formation of the organic layer 11 and that of the upper electrode 13, both of which are carried out by evaporation deposition, are continuously carried out in the same evaporation chamber. However, after the end of the evaporation deposition of the organic layer 11 and before the evaporation deposition of the upper electrode 13, the evaporation mask 29 is removed from the substrate 3.

Through the above-described steps, the organic EL display 1 having the structure described with FIG. 1 is obtained.

In the above-described manufacturing method, as described with FIG. 2C, the auxiliary interconnect 9a is formed in the same step as that of the formation of the lower electrodes 9. Furthermore, as described with FIG. 2D, the connection holes 17a that reach the auxiliary interconnect 9a are formed in the same step as that of the formation of the pixel apertures A in the insulating film 17. In addition, as described with FIGS. 2F and 1, the upper electrode 13 is so formed as to cover the organic layers 11 and be connected to the auxiliary interconnect 9a via the connection holes 17a. Therefore, without step addition, the organic EL display in which the auxiliary interconnect 9a is connected to the upper electrode 13, i.e., the organic EL display 1 described with FIG. 1, can be achieved.

This makes it possible to suppress the manufacturing cost of the organic EL display in which the auxiliary interconnect 9a is connected to the upper electrode 13, and to achieve yield enhancement through reduction in the number of manufacturing steps.

FIG. 3 is a perspective view showing a schematic configuration example of the organic EL display 1 obtained through the above-described procedure.

As shown in this example, the planar area on the substrate 3 of the organic EL display 1 is composed of a light-emission area 21 and a peripheral area 22 thereof.

In the light-emission area 21, the organic EL elements 15 arising from stacking of the lower electrode 9, the organic layer 11, and the upper electrode 13 are arranged in a matrix. Specifically, the light-emission area 21 is composed of plural pixel areas, and the organic EL element 15 is formed in each of the pixel areas.

In the peripheral area 22, peripheral circuits 22a for driving the organic EL elements 15 in the respective pixel areas and electrode terminals 22b for inputting power, signals, and so on are formed. The electrode terminal 22b is obtained by exposing a metal layer (interconnect 5).

Such an organic EL display 1 is completed through so-called scribe treatment. Specifically, the respective layers are deposited over the substrate 3 having a size including an area 23 positioned on the outer side of the peripheral area 22 (hereinafter, referred to as an "outer-peripheral area"). After the completion of the deposition of all the layers, the outer-peripheral area 23 is removed by cutting by scribe treatment and only an effective area 24 composed of the light-emission area 21 and the peripheral area 22 is left, so that the organic EL display 1 is completed.

In the manufacturing process for the organic EL display based on the above-described procedure, after the step of forming the organic EL elements arising from the stacking of the lower electrode 9, the organic layer 11, and the upper electrode 13 and before the step of removing the outer-peripheral area 23 outside the effective area 24 by scribe treatment to thereby leave only the effective area 24, a silicon nitride (SiN) film or a silicon dioxide ($SiO_2$) film covering the entire substrate including the organic EL elements is often formed as a protective film for protecting the entire substrate by CVD deposition treatment involving electrification. However, if the manufacturing process includes such a step of forming a protective film, a part that looks white turbidity is possibly generated in the vicinity of the outer periphery of the light-emission area attributed to an electrification charge generated in plasma treatment used in the CVD deposition step.

To avoid this problem, the method for manufacturing an organic EL display according to the present embodiment goes through the following characteristic procedure.

FIG. 4 is an explanatory diagram showing one example of a manufacturing step for an organic EL display according to the present embodiment.

As shown in this example, in the manufacturing of the organic EL display, a metal layer (composed of e.g. a TiAl-based alloy) serving as the interconnect 5 is deposited as a pattern on the substrate 3, and the planarization insulating film 7 is deposited thereon. Furthermore, the auxiliary interconnect 9a is formed, and the insulating film 17 is formed on the top surface side of the auxiliary interconnect 9a. Moreover, a protective film 10 for protecting the entire substrate is deposited by CVD to cover the whole of the top surface side of these layers.

However, as described above, the protective film 10 deposited by CVD will be charged due to plasma treatment. Such charging should be suppressed because it possibly causes the occurrence of film roughening on the surface of the CVD film and hence white turbidity in the effective area 24.

To suppress the charging, in the method for manufacturing an organic EL display according to the present embodiment, at the time of the deposition of the metal layer serving as the interconnect 5 before the deposition treatment for the protective film 10 by CVD, the metal layer is formed not only in the effective area 24 but also in the outer-peripheral area 23. Furthermore, a protective electrode 25 for electrically connecting the metal layer in the peripheral area 22 to the metal layer formed in the outer-peripheral area 23 (hereinafter, this metal layer will be referred to as an "outer-peripheral electrode") is formed. Specifically, in general, the metal layer pattern is deposited in such a way that the metal layer is discontinued at the boundary between the effective area 24 and the outer-peripheral area 23 (along the cut line in FIG. 4) in consideration of easiness of the subsequent scribe treatment. In contrast, in the present embodiment, the protective electrode 25 is formed by depositing the metal layer pattern in such a way that a metal portion connected to the metal layer in the peripheral area 22 and the outer-peripheral electrode across the boundary exists.

The number, positions, and so on of the protective electrodes 25 are not particularly limited as long as at least one protective electrode 25 is formed per one effective area 24.

Figure 5A:
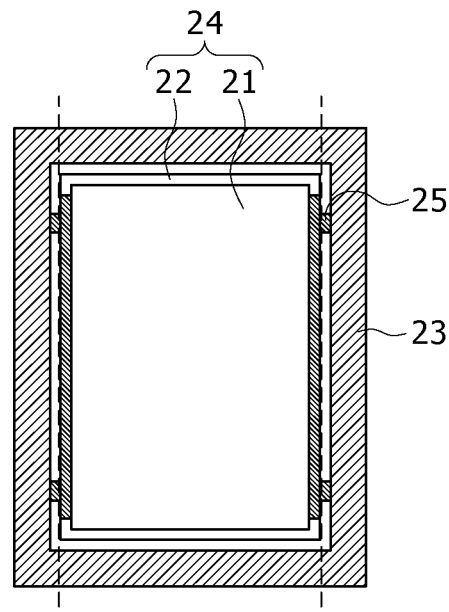
FIGS. 5A to 5C are explanatory diagrams showing specific examples of the formation positions of protective electrodes.
Figure 5B:
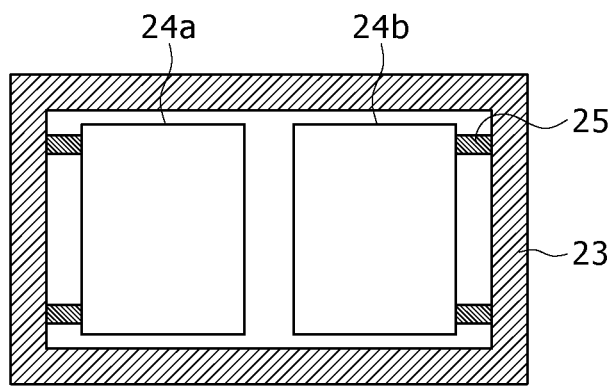
Figure 5C:
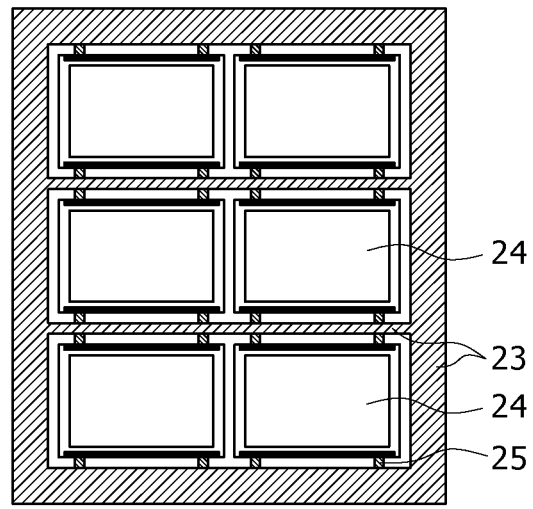

FIGS. 5A to 5C are explanatory diagrams showing specific examples of the formation positions of the protective electrodes 25.

When the light-emission area 21 has a rectangular shape, white turbidity in the light-emission area 21 tends to be frequently generated near the respective vertexes of the rectangular shape. Therefore, it will be effective that the protective electrodes 25 are formed near the respective vertexes of the light-emission area 21 as shown in FIG. 5A.

In the case of forming plural organic EL displays 1 on one substrate 3, i.e., carrying out so-called multi-panel cutting, it will be possible that, as shown in FIG. 5B, the protective electrodes 25 are formed only at positions adjacent to the outer-peripheral area 23 (in the example of FIG. 5B, two positions on the left side of an effective area 24a and two positions on the right side of an effective area 24b).

Furthermore, in the case of carrying out multi-panel cutting, it will be also possible that, as shown in FIG. 5C, the outer-peripheral area 23 is provided also between the effective areas 24 in the substrate according to need and the protective electrodes 25 connected to this outer-peripheral area 23 are formed.

Such a protective electrode 25 is to electrically connect a metal layer in the peripheral area 22 to an outer-peripheral electrode. The metal layer in the peripheral area 22 is electrically connected to the auxiliary interconnect 9a, and the electric connection of the auxiliary interconnect 9a to the lower electrode 9 or the upper electrode 13 of the organic EL element 15 in each pixel area is ensured. That is, the metal layer in the peripheral area 22 and the auxiliary interconnect 9a function as a common electrode for ensuring the electric connection to each pixel area.

Consequently, the protective electrode 25 electrically connects the outer-peripheral electrode to the common electrode for ensuring the electric connection to each pixel area, to thereby generate a charge flow from the common electrode to the outer-peripheral electrode.

In the manufacturing method that goes through the above-described characteristic procedure and the organic EL display 1 obtained through this procedure, the protective electrode 25 is formed before CVD deposition treatment involving electrification. Therefore, even when the CVD film (protective film 10) is charged in the CVD deposition treatment, the electrification charge flows from an electrode terminal in the peripheral area 22 to an outer-peripheral electrode due to a charge flow generated by the protective electrode 25. That is, a problem that the electrification charge accumulates at a certain position in the effective area 24 does not occur.

Consequently, if the manufacturing goes through the above-described characteristic procedure, the electrification charge will not accumulate at a certain position in the effective area 24. Thus, even if film deposition treatment involving electrification such as CVD deposition by use of plasma treatment is carried out in the manufacturing process for the organic EL display 1, it is possible to suppress generation of white turbidity at a certain position in the effective area 24 attributed to the electrification charge generated in the film deposition treatment. That is, the organic EL display 1 free from the generation of white turbidity can be manufactured, which allows enhancement in the manufacturing quality, manufacturing yield, and so forth. Moreover, the charge flow generated by the protective electrode 25 can avoid electric damage to electric circuits such as the TFTs 4 included in the organic EL display.

Second Embodiment

Figure 6:
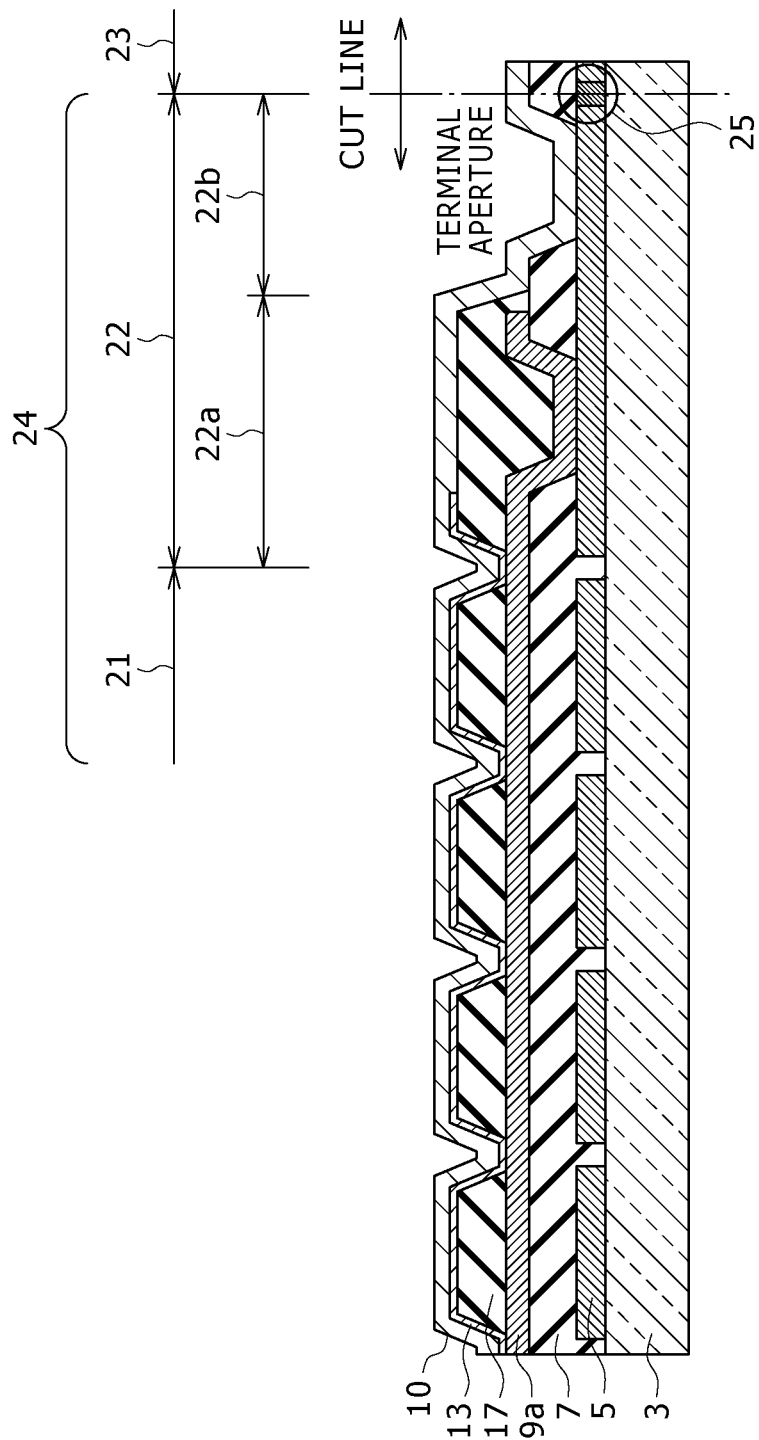
FIG. 6 is an explanatory diagram showing another example of a manufacturing step for an organic EL display according to a second embodiment of the present invention.

FIG. 6 is an explanatory diagram showing another example of a manufacturing step for an organic EL display according to a second embodiment of the present invention.

In the manufacturing of the organic EL display of this example, a metal layer (composed of e.g. a TiAl-based alloy) serving as the interconnect 5 is deposited as a pattern on the substrate 3, and the planarization insulating film 7 is deposited thereon. Furthermore, the auxiliary interconnect 9a is formed, and the upper electrode 13 is formed on the top surface side of the auxiliary interconnect 9a with the intermediary of the insulating film 17. It will be possible that the upper electrode 13 is formed of e.g. a blanket film of magnesium-silver (MgAg). Moreover, the protective film 10 for protecting the entire substrate is deposited by CVD to cover the whole of the top surface side of these layers.

However, the protective film 10 deposited by CVD will be charged due to plasma treatment. Such charging should be suppressed because it possibly causes the occurrence of film roughening on the surface of the CVD film and hence white turbidity in the effective area 24.

To suppress the charging, also in the present embodiment, similarly to the above-described first embodiment, at the time of the deposition of the metal layer serving as the interconnect 5 before the deposition treatment for the protective film 10 by CVD, the metal layer is formed not only in the effective area 24 but also in the outer-peripheral area 23. Furthermore, the protective electrode 25 for electrically connecting the metal layer in the peripheral area 22 to the outer-peripheral electrode is formed.

Such a protective electrode 25 is to electrically connect the metal layer in the peripheral area 22 to the outer-peripheral electrode. The metal layer in the peripheral area 22 is electrically connected to the auxiliary interconnect 9a, and the electric connection of the auxiliary interconnect 9a to the upper electrode 13 formed of a blanket film is ensured. That is, the metal layer in the peripheral area 22, the auxiliary interconnect 9a, and the upper electrode 13 function as a common electrode for ensuring the electric connection to each pixel area.

Consequently, the protective electrode 25 electrically connects the outer-peripheral electrode to the common electrode for ensuring the electric connection to each pixel area, to thereby generate a charge flow from the common electrode to the outer-peripheral electrode.

Specifically, also in the present embodiment, the protective electrode 25 is formed before CVD deposition treatment involving electrification similarly to the above-described first embodiment. Therefore, even when the CVD film (protective film 10) is charged in the CVD deposition treatment, the electrification charge flows from an electrode terminal in the peripheral area 22 to the outer-peripheral electrode due to a charge flow generated by the protective electrode 25. That is, a problem that the electrification charge accumulates at a certain position in the effective area 24 does not occur. Consequently, even if film deposition treatment involving electrification such as CVD deposition by use of plasma treatment is carried out in the manufacturing process for the organic EL display 1, it is possible to suppress generation of white turbidity at a certain position in the effective area 24 attributed to the electrification charge generated in the film deposition treatment. That is, the organic EL display 1 free from the generation of white turbidity can be manufactured, which allows enhancement in the manufacturing quality, manufacturing yield, and so forth. Moreover, the charge flow generated by the protective electrode 25 can avoid electric damage to electric circuits such as the TFTs 4 included in the organic EL display.

In particular, in the present embodiment, the upper electrode 13 formed of a blanket film functions as a part of the common electrode.

Figure 7:
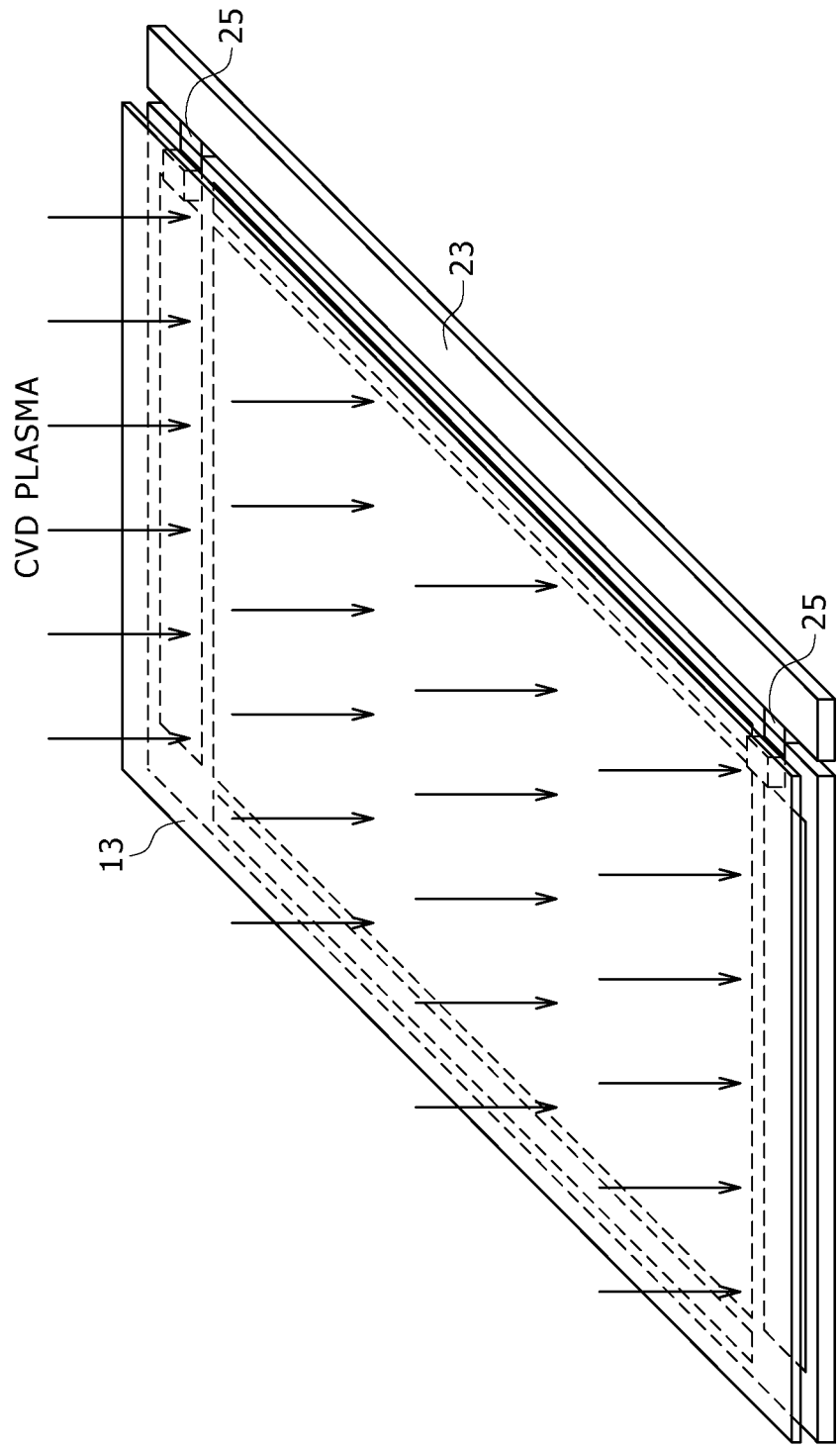
FIG. 7 is a perspective view showing another schematic configuration example of the organic EL display.

FIG. 7 is a perspective view showing a schematic configuration example of the organic EL display 1 according to the present embodiment.

In such an organic EL display 1, the upper electrode 13 covers the whole of the respective pixel areas because it is formed of a blanket film. Thus, the upper electrode 13 electrically shields electric circuits (TFT circuits, pixel circuits, peripheral circuits, and so on) formed below the upper electrode 13. Consequently, by allowing the upper electrode 13 to function as a part of the common electrode, electric damage to the electric circuits can be surely prevented and thus the electric circuits can be protected in CVD deposition treatment. Furthermore, it is also possible to surely transfer the electrification charge of the CVD film to the outer-peripheral electrode. That is, this configuration will be the most effective in terms of prevention of white turbidity in the CVD film and protection of electric circuits such as the TFTs 4.

Third Embodiment

Figure 8:
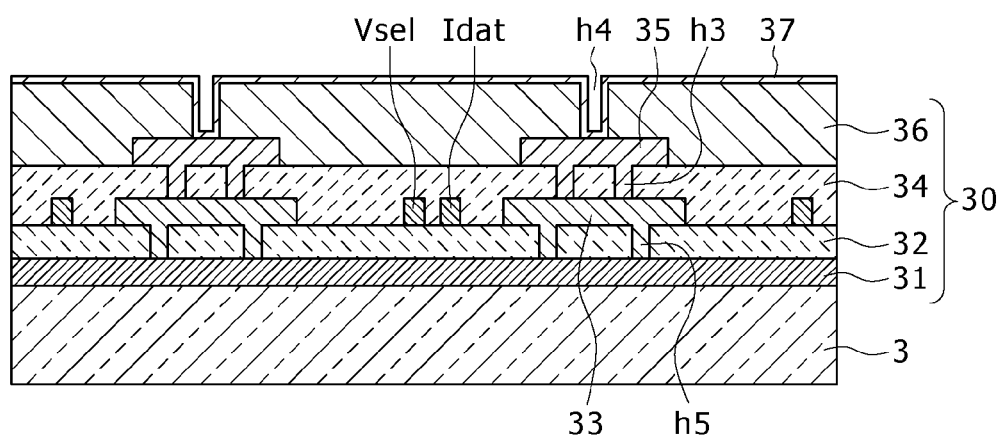
FIG. 8 is a major-part sectional view showing another example of the schematic structure of a display area of an organic EL display.

FIG. 8 is a major-part sectional view showing another example of the schematic structure of the display area of an organic EL display.

In the organic EL display of this example, a multilayer structure 30 obtained by sequentially stacking a cathode auxiliary interconnect 31, an interlayer insulating film 32, a source metal layer 33, a planarization film 34, an ITO layer 35, and a bank layer 36 is formed on the substrate 3. This multilayer structure 30 is formed on the light-emission area 21. A cathode 37 is deposited on the multilayer structure 30. The interlayer insulating film 32 electrically isolates data lines Idat and scan lines Vsel from the cathode auxiliary interconnect 31. On the interlayer insulating film 32, the source metal layer 33 patterned in the same step as that for the data lines Idat and the scan lines Vsel is formed into an island shape. The source metal layer 33 is electrically connected to the cathode auxiliary interconnect 31 via contact holes h5 opened in the interlayer insulating film 32. The insulating planarization film 34 subjected to planarization treatment is stacked on the interlayer insulating film 32, and the ITO layer 35 patterned into an island shape is formed on the planarization film 34. The ITO layer 35 is electrically connected to the source metal layer 33 via contact holes h3 opened in the planarization film 34. The plural contact holes h3 are opened along the extension direction of the cathode auxiliary interconnect 31. By providing a large number of contacts between the ITO layer 35 and the source metal layer 33, the electric resistance is decreased.

Also in the case of the organic EL display having such a structure, if a protective film (not shown) for protecting the entire substrate is deposited by CVD after the deposition of the respective layers over the substrate 3, the protective film formed by the film deposition treatment will be charged due to plasma treatment used in the film deposition. To suppress the charging, also in the present embodiment, similarly to the above-described first and second embodiments, at the time of the deposition of the metal layer serving as the cathode auxiliary interconnect 31 before the deposition treatment for the protective film by CVD, the metal layer is formed not only in the effective area 24 but also in the outer-peripheral area 23. Furthermore, the protective electrode 25 for electrically connecting the metal layer in the peripheral area 22 to the metal layer formed in the outer-peripheral area 23 (outer-peripheral electrode) to thereby generate a charge flow is formed.

In the present embodiment, the metal layer in the effective area 24 is uniformly deposited on the substrate 3 as a so-called blanket film, and the cathode auxiliary interconnect 31 is formed by this metal layer. Therefore, via the cathode auxiliary interconnect 31, the electric connection to the lower electrode 9 or the upper electrode 13 of the organic EL element 15 in each pixel area is ensured. That is, the metal layer formed in the peripheral area 22 and the cathode auxiliary interconnect 31 electrically connected to the metal layer function as a common electrode for ensuring the electric connection to each pixel area.

Also in the present embodiment, similarly to the above-described first and second embodiments, even when the CVD film is charged in CVD deposition treatment, the charge flow generated by the protective electrode 25 prevents the occurrence of accumulation of the electrification charge at a certain position in the effective area 24. Consequently, even if film deposition treatment involving electrification such as CVD deposition by use of plasma treatment is carried out in the manufacturing process for the organic EL display 1, it is possible to suppress generation of white turbidity at a certain position in the effective area 24 attributed to the electrification charge generated in the film deposition treatment. Moreover, the charge flow generated by the protective electrode 25 can avoid electric damage to electric circuits such as the TFTs 4 included in the organic EL display. That is, the manufacturing quality, manufacturing yield, and so on of the organic EL display 1 can be enhanced.

Fourth Embodiment

Figure 9:
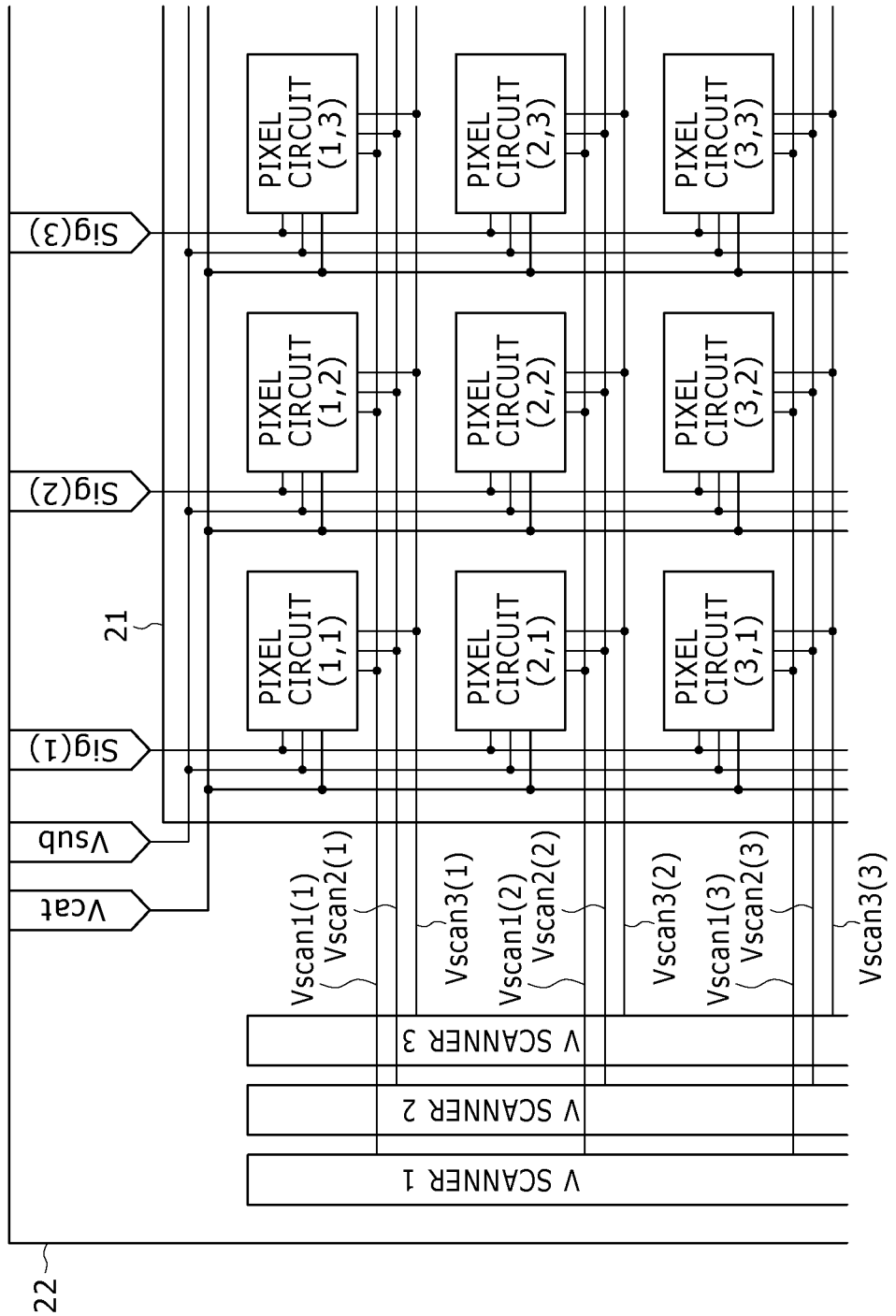
FIG. 9 is a circuit diagram schematically showing a specific example of interconnects in an effective area of an organic EL display.

FIG. 9 is a circuit diagram schematically showing a specific example of interconnects (mainly, interconnects connected to pixel circuits) in the effective area 24 of an organic EL display. As shown in this example, substantially all of the interconnects (signal lines, power supply lines, and so on) connected to the pixel circuits arranged corresponding to the respective pixel areas in the light-emission area 21 are so provided as to range across the whole of the effective area 24 except the peripheral area 22. Therefore, any of these interconnects can be used as a common electrode for ensuring the electric connection to each pixel area.

Figure 10:
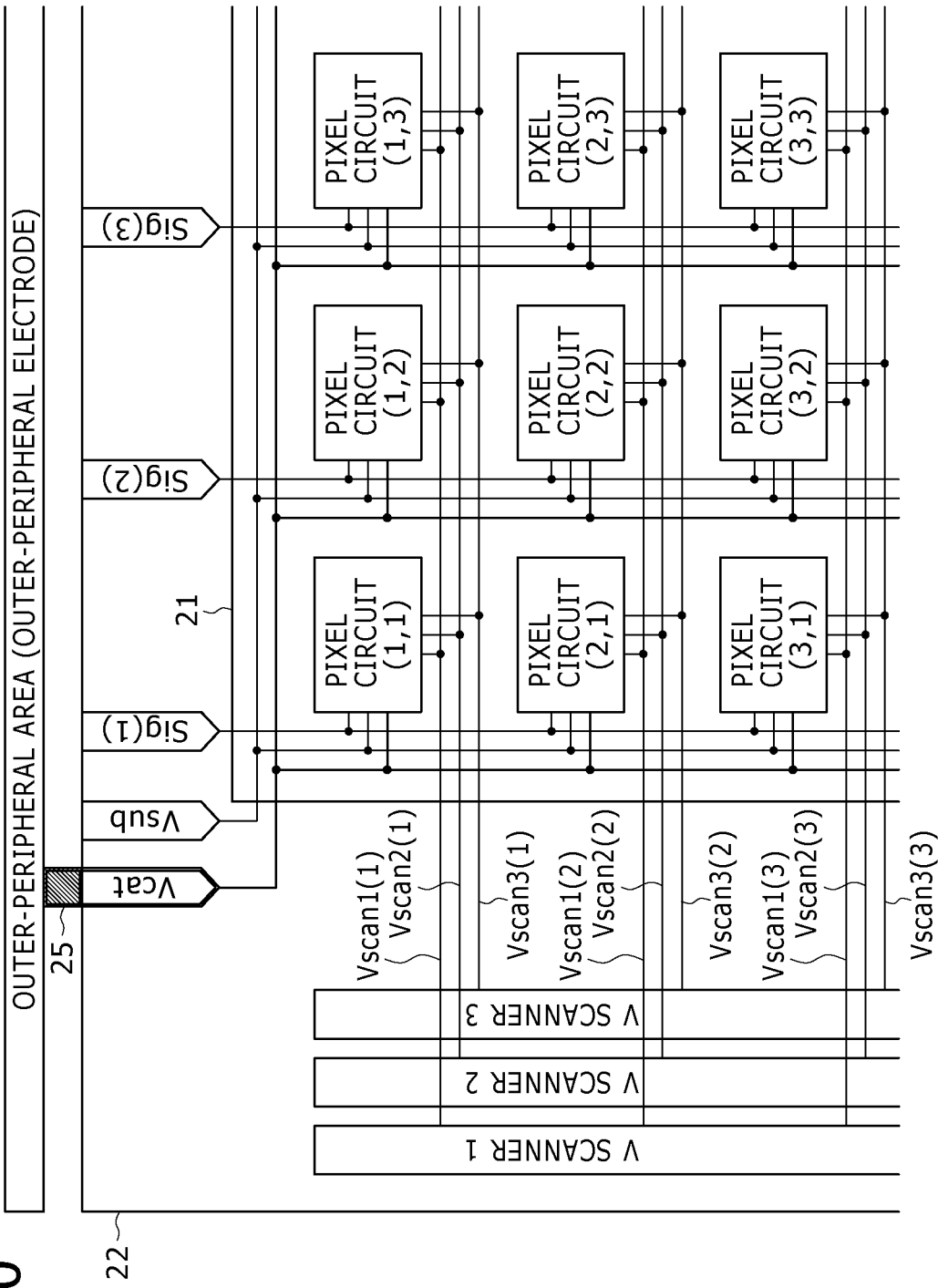
FIG. 10 is a circuit diagram schematically showing a connection example in which an upper-electrode interconnect is used as a common electrode.

FIG. 10 is a circuit diagram schematically showing a connection example in which an upper-electrode interconnect is used as a common electrode. The upper-electrode interconnect is to ensure the electric connection to each pixel area via the metal layer in the peripheral area 22, the auxiliary interconnect 9a, and the upper electrode 13 as described above for the second embodiment. Because only the circuit connection state is shown in this example, this diagram is made as if the upper-electrode interconnect is distributed only in the pixel areas. However, the actual upper-electrode interconnect is so distributed as to cover the whole of the effective area 24.

For this circuit arrangement, it will be possible to dispose the protective electrode 25 for electrically connecting an outer-peripheral electrode to an electrode terminal Vcat connected to the upper-electrode interconnect between the outer-peripheral electrode and the electrode terminal Vcat to thereby allow generation of a charge flow from the electrode terminal Vcat to the outer-peripheral electrode.

If such a circuit arrangement (electric connection form) is realized, the upper electrode 13 electrically shields the whole of the light-emission area 21, and the charge can be transferred to the outer-peripheral electrode via the protective electrode 25. Thus, this circuit arrangement will be the most effective in terms of prevention of white turbidity in a CVD film and protection of electric circuits such as the TFTs 4.

Figure 11:
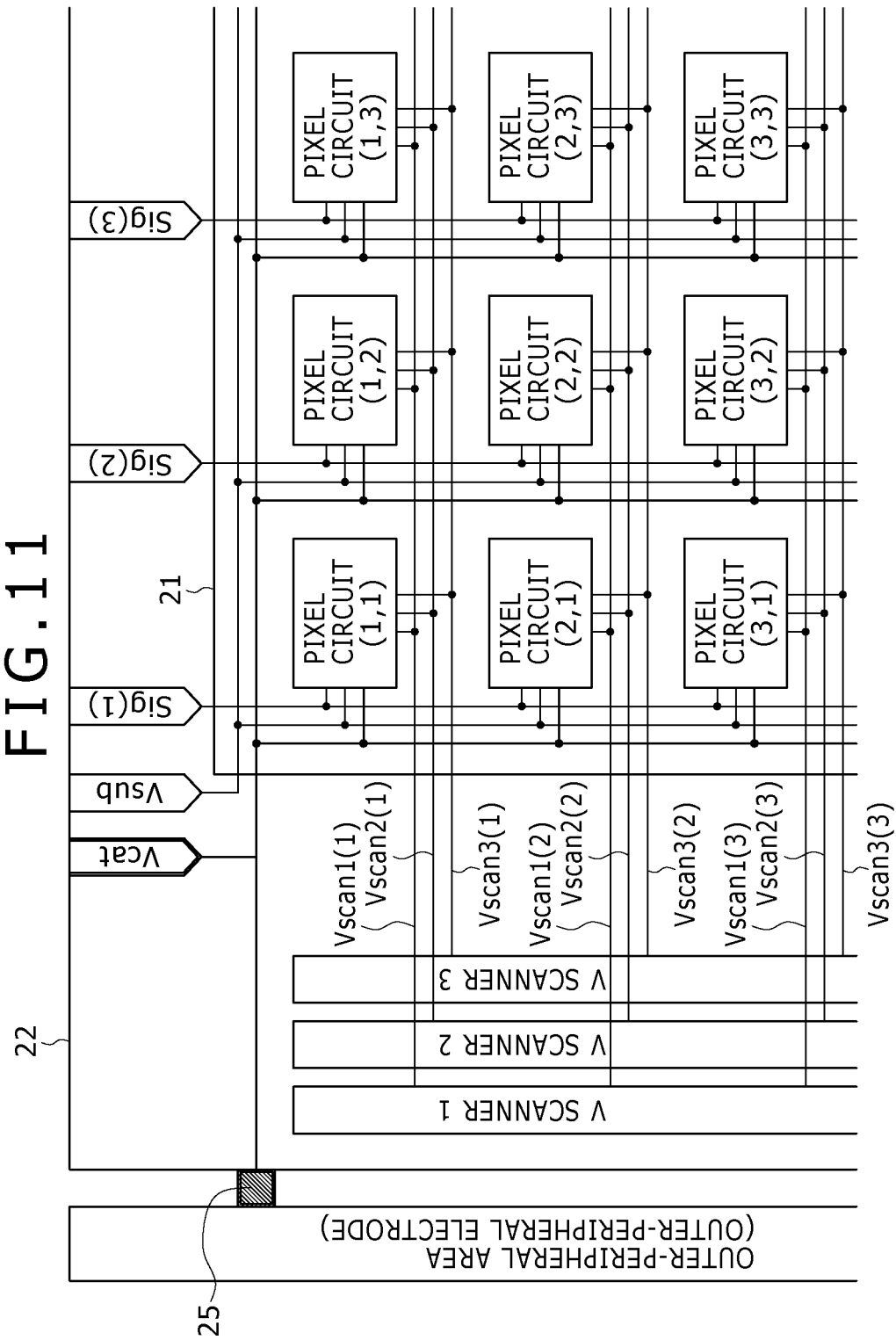
FIG. 11 is a circuit diagram schematically showing a modification example in which the upper-electrode interconnect is used as a common electrode.

FIG. 11 is a circuit diagram schematically showing a modification example in which the upper-electrode interconnect is used as a common electrode. This diagram shows a connection example in which the connection between the upper-electrode interconnect and an outer-peripheral electrode is made at a position other than the vicinity of the electrode terminal Vcat connected to the upper-electrode interconnect. That is, the protective electrode 25 may be provided at any position as long as it connects the common electrode to an outer-peripheral electrode. Therefore, it may be provided at a position other than the vicinity of the electrode terminal Vcat like this example.

Figure 12:
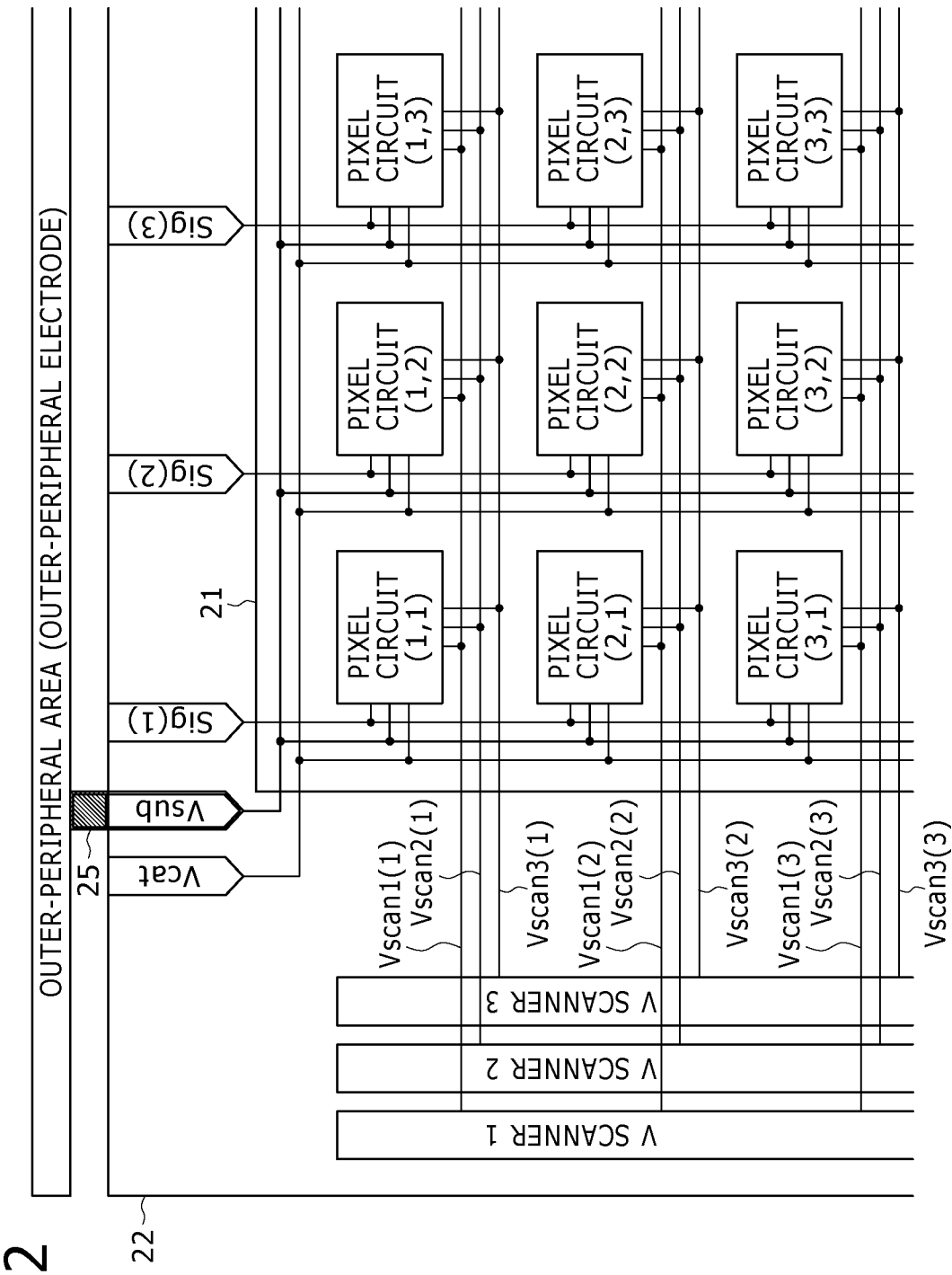
FIG. 12 is a circuit diagram schematically showing a connection example in which a power supply line is used as a common electrode.

FIG. 12 is a circuit diagram schematically showing a connection example in which a power supply line is used as a common electrode. This diagram shows an example in which the protective electrode 25 is provided between an outer-peripheral electrode and an electrode terminal Vsub connected to the power supply line. Also when the power supply line is thus utilized, the electric connection to the pixel circuits arranged corresponding to the respective pixel areas can be ensured, and thus the charge can be transferred to the outer-peripheral electrode via the protective electrode 25.

Figure 13:
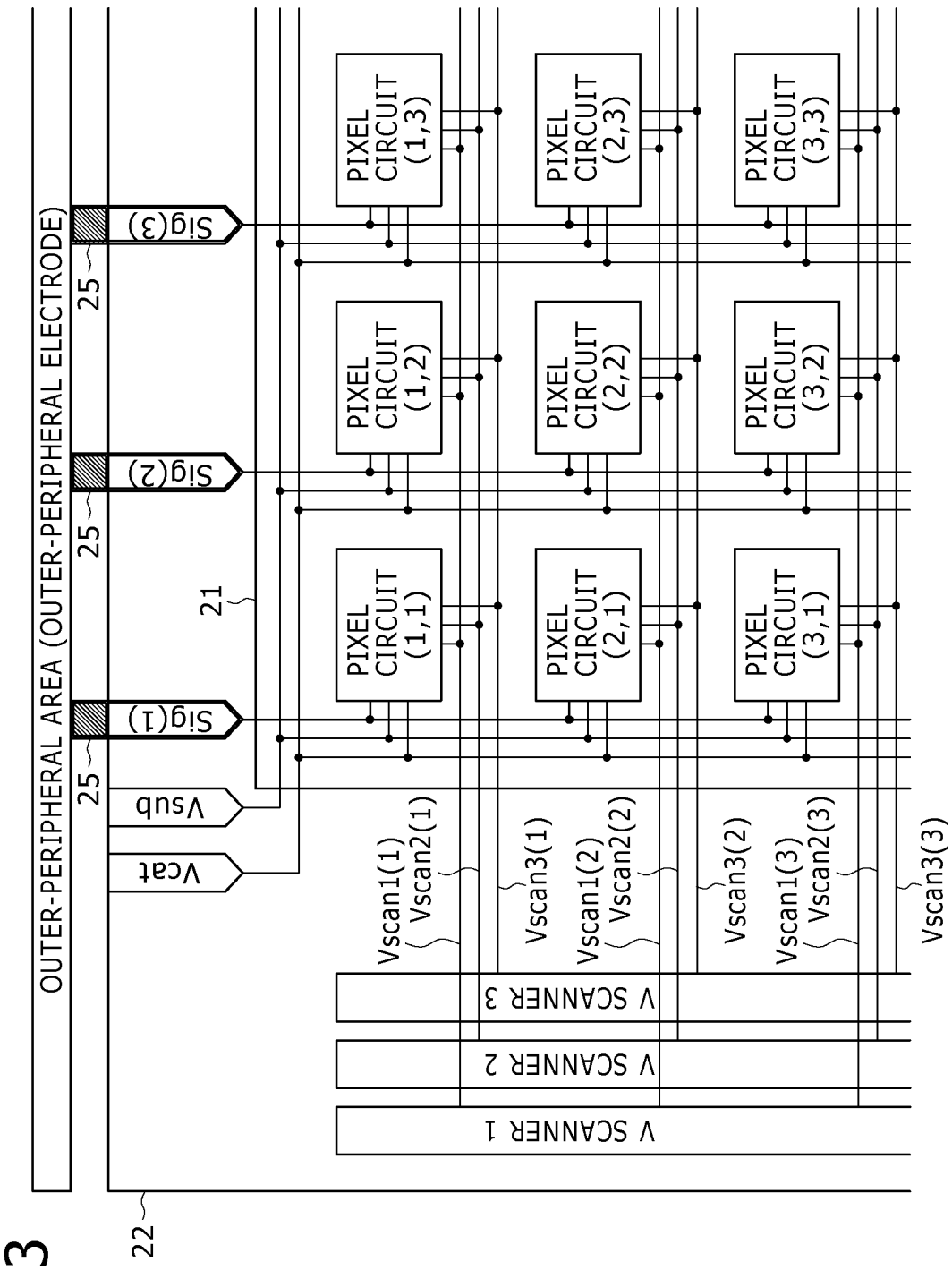
FIG. 13 is a circuit diagram schematically showing a connection example in which signal lines are used as a common electrode.

FIG. 13 is a circuit diagram schematically showing a connection example in which signal lines are used as a common electrode. When the signal lines are used as a common electrode, the whole of the effective area 24 is not covered by one signal line. Therefore, as shown in this example, the electric connection to an outer-peripheral electrode via the protective electrode 25 should be ensured for each of electrode terminals Sig(1) to Sig(3) corresponding to the respective signal lines. Also when the signal lines are thus utilized, providing the protective electrodes 25 corresponding to the respective signal lines allows ensuring of the electric connection to the respective pixel circuits, and thus permits the charge to be transferred to the outer-peripheral electrode via the protective electrodes 25.

Fifth Embodiment

The organic EL display 1 obtained based on the above-described embodiments can be used as a display in various kinds of electronic apparatus shown in FIGS. 14 to 18. Specifically, it can be used as a display in electronic apparatus in any field that displays an image or video based on a video signal input thereto or produced therein, such as a digital camera, laptop personal computer, portable terminal apparatus typified by a cellular phone, and video camera. Specific examples of electronic apparatus in which the organic EL display is used will be described below.

The organic EL display also encompasses a module-shape display with a sealed structure. Examples of such a display include a display module formed by attaching a counter part composed of e.g. transparent glass to a pixel array part. This transparent counter part may be provided with a color filer, protective film, light-shielding film, and so on. This display module may be provided with a circuit part, flexible printed circuit (FPC), and so on for inputting/outputting of signals and so forth to/from the pixel array part from/to the external.

Figure 14:
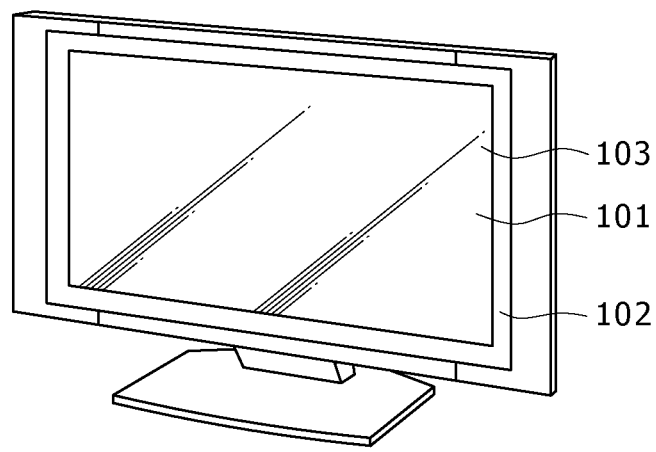
FIG. 14 is a perspective view showing a television as one specific example of electronic apparatus.

FIG. 14 is a perspective view showing a television as one specific example of the electronic apparatus. This television includes a video display screen 101 composed of a front panel 102, a filter glass 103, and so on, and is fabricated by using the organic EL display as the video display screen 101.

Figure 15A:
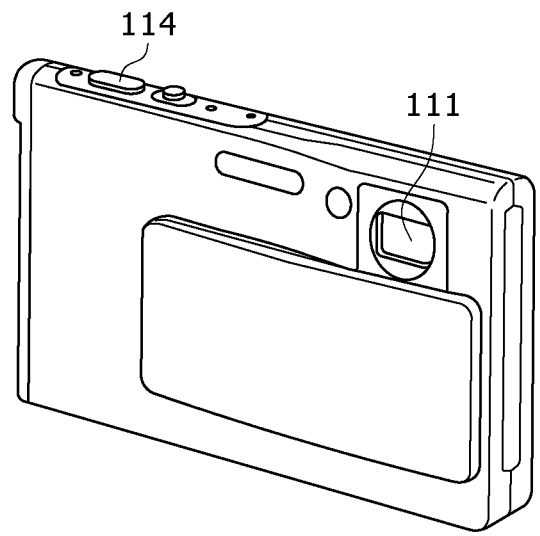
FIGS. 15A and 15B are perspective views showing a digital camera as one specific example of electronic apparatus.
Figure 15B:
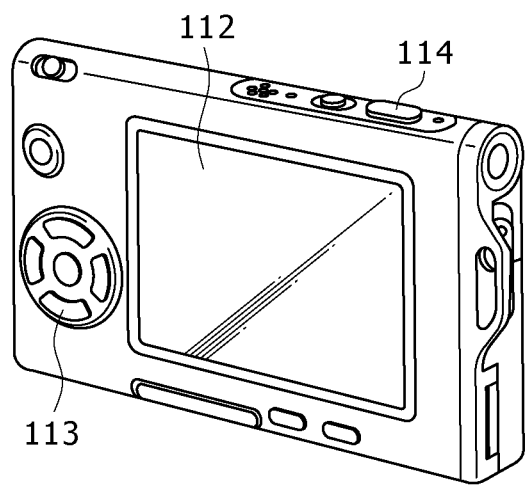

FIGS. 15A and 15B are perspective views showing a digital camera as one specific example of the electronic apparatus: FIG. 15A is a front-side view and FIG. 15B is a rear-side view. This digital camera includes a light emitter 111 for flash, a display part 112, a menu switch 113, a shutter button 114, and so on, and is fabricated by using the organic EL display as the display part 112.

Figure 16:
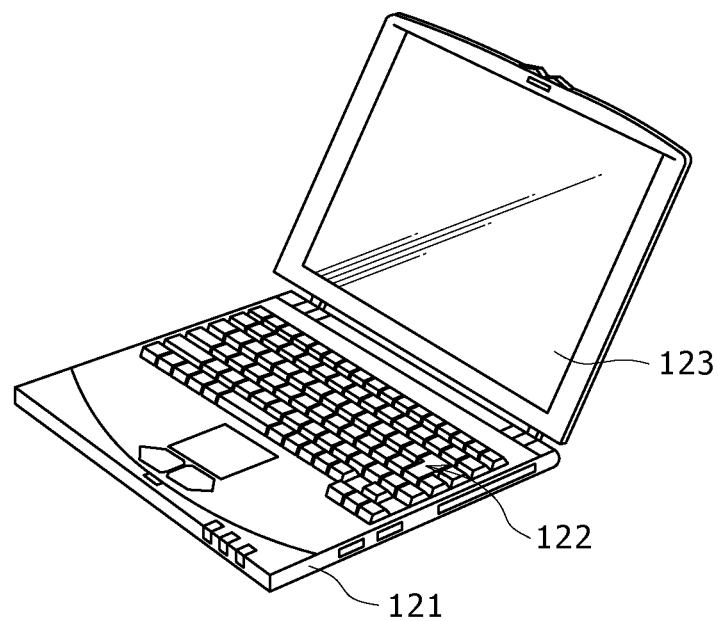
FIG. 16 is a perspective view showing a laptop personal computer as one specific example of electronic apparatus.

FIG. 16 is a perspective view showing a laptop personal computer as one specific example of the electronic apparatus. This laptop personal computer includes in a main body 121 thereof a keyboard 122 operated in inputting of characters and so forth, and a display part 123 for displaying images. The laptop personal computer is fabricated by using the organic EL display as the display part 123.

Figure 17:
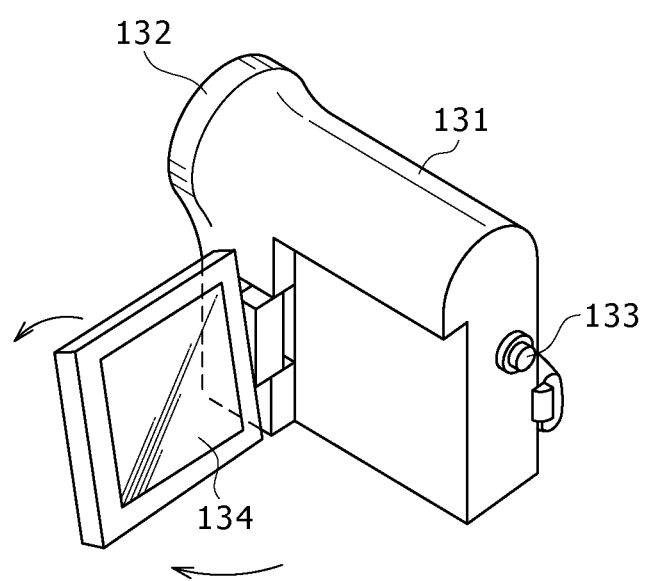
FIG. 17 is a perspective view showing a video camera as one specific example of electronic apparatus.
Figure 19:
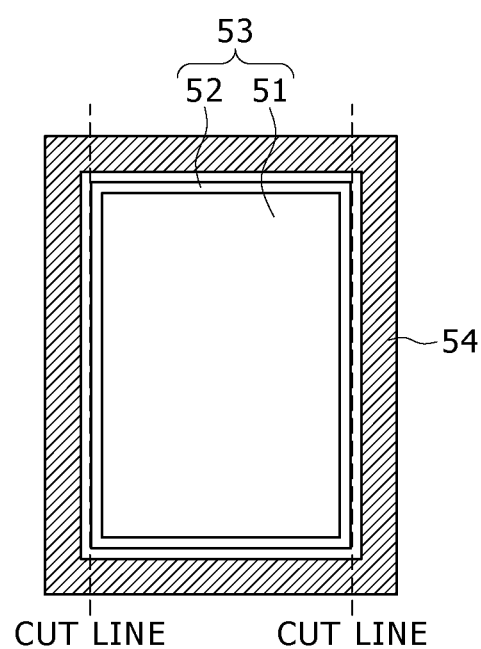
FIG. 19 is an explanatory diagram showing one example of a manufacturing step for an organic EL display in a related art.

FIG. 17 is a perspective view showing a video camera as one specific example of the electronic apparatus. This video camera includes a main body 131, a lens 132 that is disposed on the front side of the camera and used to capture a subject image, a start/stop switch 133 for imaging operation and a display part 134. The video camera is fabricated by using the organic EL display as the display part 134.

FIGS. 18A to 18G are diagrams showing a cellular phone as portable terminal apparatus as one specific example of the electronic apparatus: FIGS. 18A and 18B are front view and side view, respectively, of the opened state, and FIG. 18C to 18G are front view, left-side view, right-side view, top view, and bottom view, respectively, of the closed state. This cellular phone includes an upper casing 141, a lower casing 142, a connection (hinge) 143, a display 144, a sub-display 145, a picture light 146 and a camera 147. The cellular phone is fabricated by using the organic EL display as the display 144 and the sub-display 145.

In the above description of the first to fifth embodiments, specific examples of preferred embodiments of the present invention are explained. However, the present invention is not limited thereto but can be properly changed without departing the gist thereof. For example, the materials, thicknesses, deposition methods, deposition conditions, and so on of the respective components cited as examples for the embodiments are not particularly limited but can be properly changed according to need.

It should be understood by those skilled in the art that various modifications, combinations, sub-combinations and alterations may occur depending on design requirements and other factor in so far as they are within the scope of the appended claims or the equivalents thereof.

What is claimed is:

1. A method for manufacturing an organic electroluminescence display including a plurality of pixel areas, the method comprising the steps of:
    forming a multilayer structure for each pixel area in an effective area of a substrate, the multilayer structure including (1) a lower electrode, (2) an organic layer, and (3) an upper electrode;
    electrically connecting the pixel areas with a common electrode;
    forming a protective electrode for electrically connecting the common electrode to an outer-peripheral electrode in an area that is outside of the effective area, the protective electrode being continuous across the boundary between the outer-peripheral electrode and the effective area and effective to generate a charge flow from the common electrode to the outer-peripheral; and
    forming an insulating layer over the substrate while allowing charges generated by the formation of the insulating to discharge to an area outside of the substrate therefrom via the protective electrode.

2. The method for manufacturing the organic electroluminescence display according to claim 1, wherein the common electrode includes an auxiliary interconnect in the same layer as the lower electrode.

3. The method for manufacturing the organic electroluminescence display according to claim 1, wherein
    the common electrode includes the upper electrode, and
    the upper electrode covers the pixel areas.

4. A method for manufacturing an organic electroluminescence display comprising the steps of:
    forming organic electroluminescence elements each having a multilayer structure for each pixel area in an effective area of a substrate, the multilayer structure including (1) a lower electrode, (2) an organic layer, and (3) an upper electrode;
    electrically connecting the pixel areas with a common electrode; and
    removing an area of the electroluminescence elements that is outside of the effective area,
    wherein,
        after the step of forming the organic electroluminescence elements and before the step of removing an area of the electroluminescence elements that is outside of the effective area, an insulating protective film is formed over the substrate and the organic electroluminescence elements by a film deposition treatment involving electrification, and
        a protective electrode for electrically connecting the common electrode to an outer-peripheral electrode is formed in the area that is outside of the effective area, the protective electrode being continuous across the boundary between the outer-peripheral electrode and the effective area and effective to generate a charge flow from the common electrode to the outer-peripheral electrode in the film deposition treatment for the protective film and allowing charges generated in the insulating protective layer during the formation of the insulating protective layer to discharge to an area outside of the substrate during the formation of the insulating protective layer.

5. The method for manufacturing the organic electroluminescence display according to claim 1, wherein the insulating protective film is made from silicon nitride or silicon dioxide.

6. The method for manufacturing the organic electroluminescence display according to claim 1, wherein the insulating protective film covers the entire top surface of the substrate.

7. The method of claim 1, wherein said charges are removed from said insulating film by means of a protective electrode.

8. The method of claim 1,
    wherein,
        the organic electroluminescent display includes a drive circuit configured to drive each pixel located in the pixel areas via an electric path, and
        the electric path is independent of the drive circuit.

9. The method of claim 8, further comprising the step of:
    disconnecting the electric path from the substrate after the step of forming the insulating layer.

10. The method of claim 8, further comprising the step of attaching circuitry configured to provide an image signal to the organic electroluminescence display, wherein the organic electroluminescence display is suitable for an electronic device selected from a group consisting of a television, a digital camera, a portable computer, a mobile phone, and a video camera.

11. The method of claim 1, wherein the step of forming the insulating layer includes plasma generation via a CVD deposition treatment process.

12. The method of claim 4, wherein the organic electroluminescent display includes a drive circuit configured to drive each pixel located in the pixel areas via an electric path, and the electric path is independent of the drive circuit.

13. The method of claim 12, further comprising the step of disconnecting the electric path from the substrate after the step of forming the insulating layer.

14. The method of claim 4, wherein the step of forming the insulating layer includes plasma generation via a CVD deposition treatment process.

* * * * *